(12) United States Patent
Bevara et al.

(10) Patent No.: US 11,381,232 B2
(45) Date of Patent: Jul. 5, 2022

(54) DUTY CYCLE CORRECTION METHOD AND CIRCUIT THEREOF

(71) Applicant: Samsung Electronics Co., Ltd., Suwon-si (KR)

(72) Inventors: Vasu Bevara, Bangalore (IN); Aswani Aditya Kumar Tadinada, Bangalore (IN); Kishan Reddy Gonapati, Bangalore (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/196,478

(22) Filed: Mar. 9, 2021

(65) Prior Publication Data

US 2022/0131537 A1   Apr. 28, 2022

(30) Foreign Application Priority Data

Oct. 26, 2020   (IN) .............................. 202041046538

(51) Int. Cl.
*H03K 5/156*   (2006.01)
*H03K 5/131*   (2014.01)
*H03K 5/133*   (2014.01)

(52) U.S. Cl.
CPC ........... *H03K 5/1565* (2013.01); *H03K 5/131* (2013.01); *H03K 5/133* (2013.01)

(58) Field of Classification Search
None
See application file for complete search history.

(56) References Cited

U.S. PATENT DOCUMENTS 5,757,218 A * 5/1998 Blum ....................... H03K 5/05 327/172

\* cited by examiner

*Primary Examiner* — Cassandra F Cox
(74) *Attorney, Agent, or Firm* — Harness, Dickey & Pierce, P.L.C.

(57) ABSTRACT

The inventive concepts relate to methods for duty cycle correction of an input signal and circuits thereof. The method comprising following operations of generating, a plurality of intermediate delayed input signals, each delayed by at least a unit delay, through a delay line driven by the input signal, selecting from among the plurality of delayed input signals, through a first control signal, where the selection is based on number of unit delays in the input signal, generating at least an incremented duty signal and a decremented duty signal based on the selected delayed signals and the input signal, generating, a corrected duty cycle based on the selection of at least one of: the incremented duty cycle or decremented duty cycle by providing a second control signal. The inventive concepts offer low power consumption and low area for correction or adjustment of the duty cycle of the input signal with higher probability or guaranteed monotonicity.

17 Claims, 11 Drawing Sheets

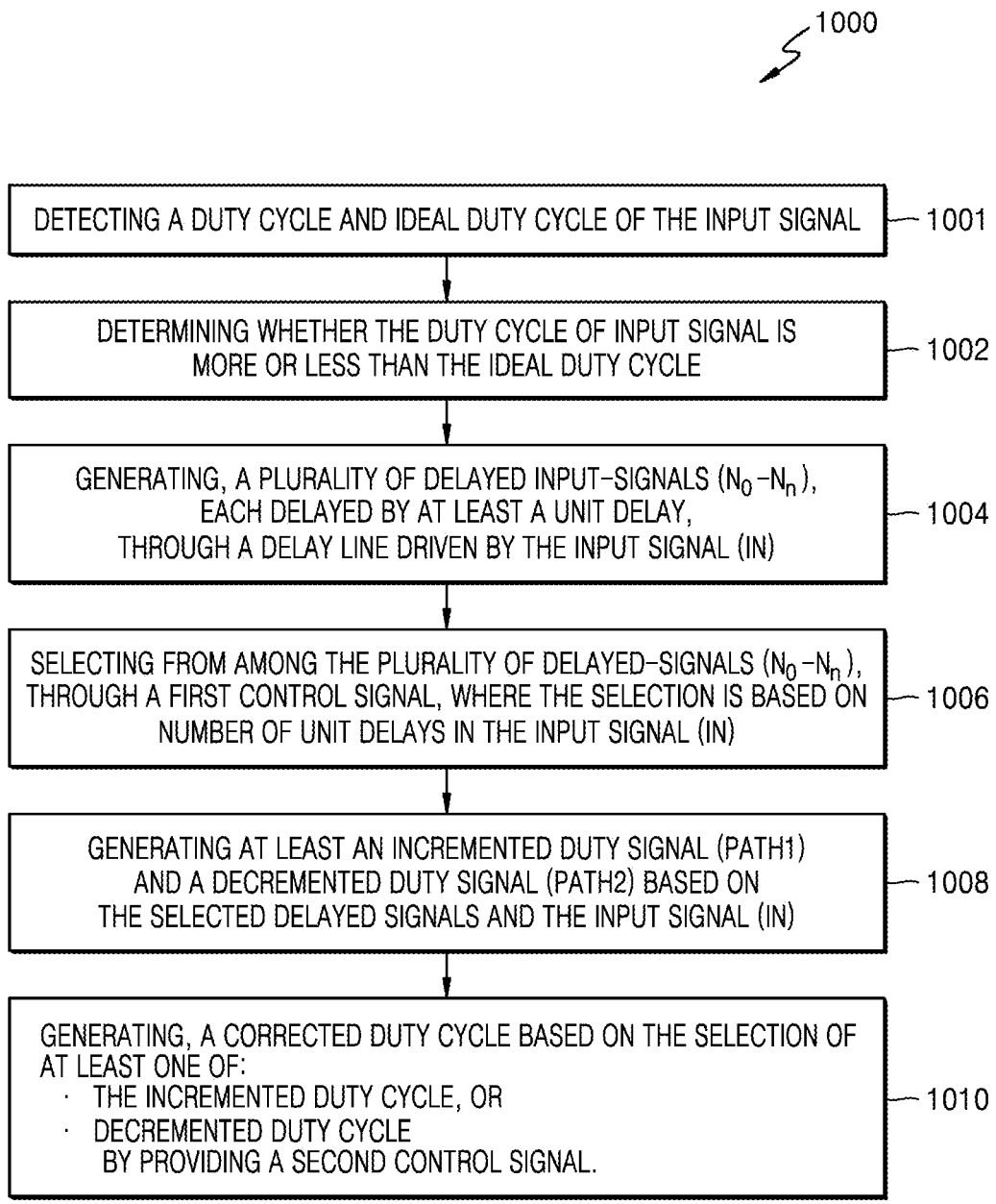

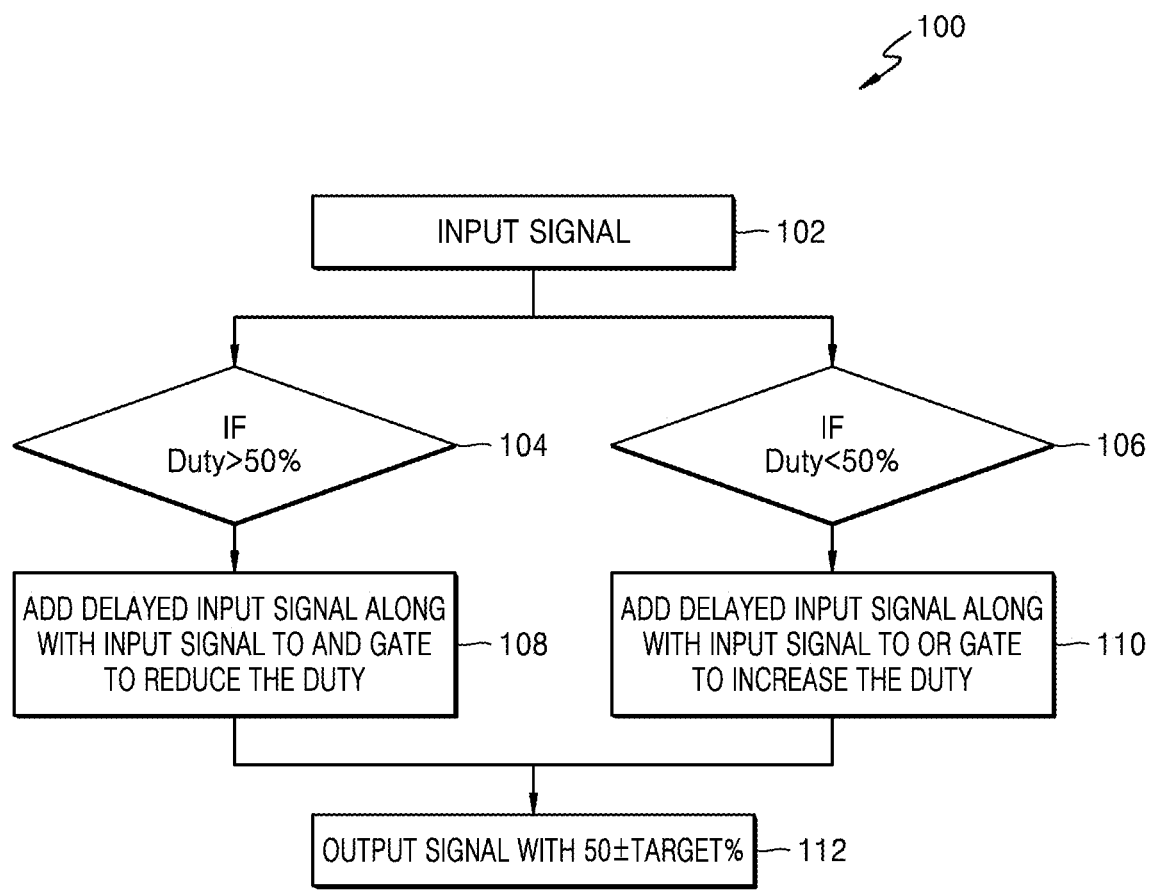

DUTY CYCLE CORRECTION METHOD AND CIRCUIT THEREOF

CROSS-REFERENCE TO RELATED APPLICATIONS

This application claims the benefit of Indian Patent Application No. 202041046538 filed on Oct. 26, 2020, in the Indian Patent Office, the disclosure of which is incorporated herein in its entirety by reference.

FIELD

The inventive concepts relate to the fields of semiconductor circuits and more particularly, to a duty cycle correction method and circuit thereof.

BACKGROUND

The concept of duty cycle correction (DCC) is commonly used to adjust the duty cycle of the signal and generally used in wired-communication such as serial links and parallel links. The duty cycle correction (DCC) generally finds its applications in software-defined radios, cognitive radios, etc. For many applications, such as, System-on-Chip which may be sensitive to the duty cycle of the clock signals, the duty cycle correction circuits or the adjustment circuits to correct the duty cycle of the signals are generally required prior to use in the application. It may be desirable for the signal to have a consistent duty cycle as for the proper operation of many digital electronic devices a precisely controlled duty cycle is beneficial. Studies reveal that with an increase in the frequency of the external clock signal, variations in the duty cycle of the clock signal are experienced, which eventually results in an error in the duty cycle.

Typically, an ideal duty cycle for a clock/data signal is typically 50%. However, due to the increase in the clock frequency, the period of the clock signals reduces. The variation in the clock may result in a variation in the duty cycle. Although the lower clock/data frequency signal can be ignored, the higher frequency clock/data signal may result in a more significant shift in the duty cycle. In such a scenario, if the duty cycle of the clock/data signal is not corrected, timing errors may result in malfunctioning of the device and/or eventually device failure.

Studies also reveal that many duty correction circuits are meant to correct the duty when a clock signal and the inverse of the clock signal have a similar duty error. However, these circuits usually suffer performance drawbacks due to the reason that such duty correction circuits may correct only one of the duties, but not the other.

Another drawback associated with the existing DCC circuits may be related to the limitation of adjustment resolution, e.g., non-uniform step sizes, width, etc. To overcome such limitations, the existing methods meant for improving the adjustment resolution usually lead to increased power consumption, an increase in size and/or have limited range. Due to the limitations on size and power consumption, reduction in speed of such DCC circuits results in increasing the step size and/or increasing power consumption which eventually leads to impractical application.

Another shortcoming related to the existing DCC circuits is that such circuits fail to maintain the monotonicity of the signals obtained through the delay lines. This shortcoming may arise due to the device mismatch in the delay elements which in turn results in failures at the system level.

SUMMARY

This summary is provided to introduce a selection of concepts in a simplified format that is further described in the detailed description of the inventive concepts. This summary is not intended to identify key or essential inventive concepts of the claimed subject matter, nor is it intended for determining the scope of the claimed subject matter.

The present inventive concepts may obviate aforesaid drawbacks plaguing the state of the art. The present inventive concepts nay further provide a method and a system that can offer a wider range of duty correction with higher probability or guaranteed monotonicity.

The present inventive concepts are based on low power low area duty cycle correction with higher probability or guaranteed monotonicity.

In one aspect of the present disclosure, there is provided a method for duty cycle correction of an input signal, comprising generating, a plurality of intermediate delayed input signals, each delayed by at least a unit delay, through a delay line driven by the input signal. The method further comprises selecting from among the plurality of delayed input signals, through a first control signal, where the selection is based on a number of unit delays in the input signal. The method further comprising generating at least an incremented duty signal (Path1) and a decremented duty signal (Path2) based on the selected delayed signals and the input signal. The method further comprises generating, a corrected duty cycle based on the selection of at least one of the incremented duty cycles or decremented duty cycles by providing a second control signal.

In another aspect of the present disclosure there is provided a Duty Cycle Correction (DCC) circuit, comprising a delay-line comprising a plurality of delay components, driven by an input signal and configured to generate a plurality of delayed input signals, each said delayed input signal is delayed by at least a unit delay, first logic, controlled by a first control signal, configured to receive the plurality of delay-signals and configured to select at least one of the delayed-signal as a first signal, a plurality of duty scaling components comprising one or more of an incrementing component configured to generate at least an incremented duty signal (Path1) when a Duty Cycle of the input signal is less than the ideal duty cycle and a decrementing component configured to generate a decremented duty signal (Path2) when the Duty cycle of the input signal is more than the ideal Duty Cycle, based on the selected delayed signals and the input signal, path correction logic configured to generate a corrected duty cycle based on the selection of at least one of: the incremented duty cycle or decremented duty cycle by providing a second control signal, wherein the increment or decrement in duty cycle is performed until the detected duty cycle of the input signal remains lesser or greater than a threshold level.

In another aspect of the present disclosure there is provided a Duty Cycle Correction (DCC) circuit, comprising processing circuitry configured to generate a plurality of delayed input signals, each said delayed input signal is delayed by at least a unit delay, receive the plurality of delay-signals to select at least one of the delayed-signal as a first signal, generate an incremented duty signal (Path1) when a Duty Cycle of the input signal is less than an ideal duty cycle and a decremented duty signal (Path2) when the Duty cycle of the input signal is more than the ideal Duty Cycle, based on the first signal and the input signal, generate a corrected duty cycle based on the selection of at least one of: the incremented duty cycle or decremented duty cycle by providing a second control signal, wherein the increment or decrement in duty cycle is performed until the detected duty cycle of the input signal remains lesser or greater than a threshold level.

To further clarify the advantages and features of the present inventive concepts, a more particular description of the inventive concepts will be rendered by reference to example embodiments thereof, which is illustrated in the appended drawings. It is appreciated that these drawings depict example embodiments of the inventive concepts and are therefore not to be considered limiting of its scope. The inventive concepts will be described and explained with additional specificity and detail with the accompanying drawings.

BRIEF DESCRIPTION OF FIGURES

These and other features, aspects, and advantages of the present inventive concepts will become better understood when the following detailed description is read with reference to the accompanying drawings in which like characters represent like parts throughout the drawings, wherein:

FIG. 1(A & B) illustrates a control-flow for duty cycle correction of an input signal for a transceiver, in accordance with another example embodiment of the present subject matter;

FIG. 2-B illustrates an arrangement of delay elements in reference to FIG. 2-A, in accordance with another example embodiment of the present subject matter;

FIG. 3-B illustrates an arrangement of delay elements in reference to FIG. 3-A, in accordance with another example embodiment of the present subject matter;

Figure 2A:
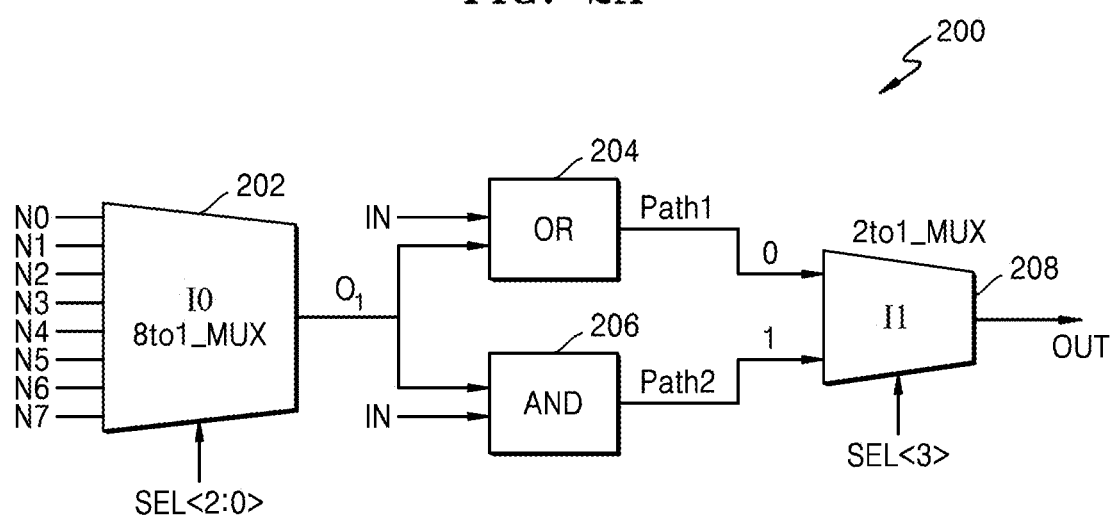
FIG. 2-A illustrates an implementation of the duty correction control circuit, in accordance with another example embodiment of the present subject matter.

Further, skilled artisans will appreciate that elements in the drawings are illustrated for simplicity and may not have been drawn to scale. For example, the flow charts illustrate the method in terms of the most prominent operations involved to help improve understanding of aspects of the present inventive concepts. Furthermore, in terms of the construction of the device, one or more components of the device may have been represented in the drawings by conventional symbols, and the drawings may show only those specific details that are pertinent to understand the example embodiments of the present inventive concepts so as not to obscure the drawings with details that will be readily apparent to those of ordinary skill in the art having the benefit of the description herein.

DETAILED DESCRIPTION OF FIGURES

For the purpose of promoting an understanding of the principles of the inventive concepts, reference will now be made to example embodiments illustrated in the drawings and specific language will be used to describe the same. It will nevertheless be understood that no limitation of the scope of the inventive concepts is thereby intended, such alterations and further modifications in the illustrated system, and such further applications of the principles of the inventive concepts as illustrated therein being contemplated as would normally occur to one skilled in the art to which the inventive concepts relate.

It will be understood by those skilled in the art that the foregoing general description and the following detailed description are explanatory of the present disclosure and are not intended to be restrictive thereof.

Reference throughout this specification to "an aspect", "another aspect" or similar language means that a particular feature, structure, or characteristic described in connection with the example embodiments is included in at least one example embodiment of the present disclosure. Thus, appearances of the phrase "in example embodiments", "in another example embodiment" and similar language throughout this specification may, but do not necessarily, all refer to the same example embodiments.

The terms "comprises", "comprising", or any other variations thereof, are intended to cover a non-exclusive inclusion, such that a process or method that comprises a list of operations does not include only those operations but may include other operations not expressly listed or inherent to such process or method. Similarly, one or more devices or sub-systems or elements or structures or components proceeded by "comprises . . . a" does not, without more constraints, preclude the existence of other devices or other sub-systems or other elements or other structures or other components or additional devices or additional sub-systems or additional elements or additional structures or additional components.

Unless otherwise defined, all technical and scientific terms used herein have the same meaning as commonly understood by one of ordinary skill in the art to which this disclosure belongs. The system, methods, and examples provided herein are illustrative only and not intended to be limiting.

The present inventive concepts relate to a method for duty cycle correction of an input signal (IN) from a device such as a transceiver, which comprises analyzing the duty of the input signal (IN). The analysis of the input signal comprises investigating whether the input signal (IN) has the duty greater than or less than a certain level, for example, 50%. Further, if the duty appears to be greater than the level, for example, 50%, the duty of the signal is reduced through AND logic implemented over the input signal and the corresponding delayed signal. Similarly, if the duty appears to be less than the level, for example, 50%, then the duty of the signal is increased through OR logic implemented over the input signal and the corresponding delayed signal. The delayed signal can be a delayed input signal with one or more unit delays, wherein the unit of delays is based on the level of duty correction required. An output signal can be obtained with corrected duty.

FIG. 1-A illustrates a control-flow (1000) of a method for duty cycle correction of an input signal (IN) for a transceiver, in accordance with another example embodiment of the present subject matter.

In an implementation, FIG. 1-A represents the method for duty cycle correction of an input signal (IN) comprising: detecting (operation 1001) a Duty Cycle of the input signal (IN) and an Ideal Duty Cycle of the input signal received by the transceiver, followed by determining (operation 1002) whether the Duty Cycle of the input signal is more or less than the Ideal Duty Cycle, wherein the Ideal Duty Cycle corresponding to Unit-Interval (UI).

The method further comprises generating (operation 1004), a plurality of intermediate delayed input signals ($N_0$-$N_n$), each delayed by at least a unit delay, through a delay line driven by the input signal (IN).

The method further comprises selecting (operation 1006) from among the plurality of delayed-signals ($N_0$-$N_n$), through a first control signal, where the selection is based on the number of unit delays in the input signal (IN). The selection of at least one delayed input signal from among the plurality of delayed input signals ($N_0$-$N_n$), is based on the determined difference between the Duty Cycle of the input signal and the Ideal Duty Cycle. In one of the implementation, as a non-limiting factor, an 8:1 multiplexer can be implemented for the selection of one of the delayed-signals ($N_0$-$N_n$).

The method further comprises generating (operation 1008) at least one of an incremented duty signal (Path1) when the Duty Cycle of the input signal is less than the Ideal Duty Cycle, and a decremented duty signal (Path2) when the Duty Cycle of the input signal is more than the Ideal Duty Cycle, based on the selected delayed signals and the input signal (IN). The incremented duty signal (Path1) can be obtained using OR logic, and the decremented duty signal (Path2) can be obtained using AND logic, wherein the increment/decrement in the duty of the input signal may be based on the difference between the existing duty of the input signal and a required level of the duty for the input signal. Therefore, the selection of the delayed signal ($N_0$-$N_n$) is based on the required level of the decrement/increment in the duty of the input signal. The method further comprises generating a corrected duty cycle based on the selection of at least one of the incremented duty cycles or decremented duty cycle by providing a second control signal. The corrected duty cycle is outputted after the increment in the duty cycle or decrement in the duty cycle, where said increment in duty cycle is performed till the detected duty cycle of the input signal reaches less than a threshold or the decrement is the duty cycle is performed till the detected duty cycle of the input signal reaches greater than the threshold. As a non-limiting factor, the threshold may be considered as 50 percent. A 2:1 multiplexer may be used, as a non-limiting aspect, for the selection of one of the incremented/decremented duty paths (Path1) or (Path2). A signal with a corrected duty cycle can be obtained from the output of the multiplexer.

FIG. 1-B illustrates an example implementation of method (100) operations for duty cycle correction of an input signal, in accordance with another example embodiment of the present subject matter.

After the analysis at operation 102, at least one of operation 104 and/or operation 106, is followed if the duty of the input signal (IN) is greater than and/or less than 50%, respectively. The present operation 102 corresponds to operation 1004.

At operation 108, the duty of the signal is decremented, when the duty of the input signal (IN) is greater than 50%, the decrement in the duty of the signal is achieved through AND logic (108) performed on the input signal (IN) and an input signal (INB) with one or more unit delays. The present operation 108 corresponds to operations 1006 and 1008.

Similarly, at operation 110, the duty of the signal is incremented, when the duty of the input signal (IN) is less than 50%, the increment in the duty of the signal is achieved through OR logic (110) performed on the input signal (IN) and an input signal (INB) with one or more unit delays. The present operations 108 and 110 correspond to operations 1006 and 1008.

At final operation 112, one of the paths is selected with the corrected duty of the signal with the target incremented/decremented duty of the signal.

Figure 2B:
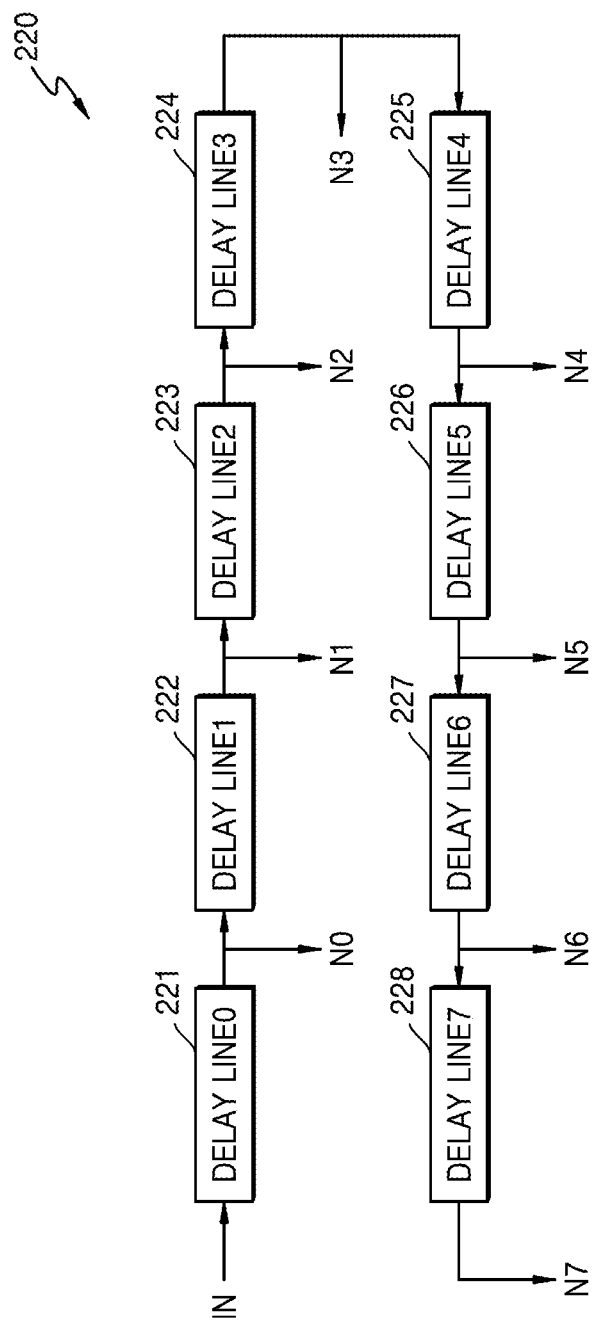

FIG. 2-A depicts an implementation of duty correction control circuit and FIG. 2-B depicts an arrangement of delay elements (220) in reference to FIG. 2-A, in accordance with another example embodiment of the present subject matter.

In an implementation of the present disclosure, there is provided a method for duty cycle correction of an input signal (IN), comprising at least a operation of generating, a plurality of intermediate delayed input signals ($N_0$-$N_n$), each delayed by at least a unit delay, through a delay line (221-228) driven by the input signal (IN), as referred in FIG. 2-B.

The method further comprises selecting from among the plurality of delayed input signals ($N_0$-$N_n$), through a first control signal, referred to as SEL<2:0> in FIG. 2-A, where the selection is based on the number of unit delays in the input signal (IN). In one of the implementation, as a non-limiting factor, an 8:1 multiplexer (202) can be implemented for the selection of one of the delayed input signals ($N_0$-$N_n$).

The method further comprises generating at least an incremented duty signal (Path1) and a decremented duty signal (Path2) based on the selected delayed signals and the input signal (IN). The incremented duty signal (Path1) can be obtained using OR logic (110), and the decremented duty signal (Path2) can be obtained using AND logic (108), wherein the increment/decrement in the duty of the input signal may be based on the difference between the existing duty of the input signal and a required level of the duty for the input signal. Therefore, the selection of the delayed input signal ($N_0$-$N_n$) is based on the required-level of the decrement/increment in the duty of the input signal.

The method further comprises generating, a corrected duty cycle based on the selection of at least one of the incremented duty cycles or decremented duty cycle by providing a second control signal, referred to as SEL<3> in FIG. 2-A. A 2:1 multiplexer (208) may be used, as a non-limiting aspect, for the selection of one of the incremented/decremented duty paths (Path1) or (Path2). A signal (112) with a corrected duty cycle can be obtained from the output of the multiplexer (208).

In an implementation of the present disclosure, there is provided a duty cycle correction (DCC) circuit (200) for a transceiver, for correcting or adjusting the duty of an input signal (IN). The DCC circuit (200) comprises a duty cycle detector to detect a Duty Cycle and an Ideal Duty Cycle of the input signal received by the transceiver; and to determine whether the Duty Cycle of the input signal is more or less than an Ideal Duty Cycle, wherein the Ideal Duty Cycle corresponding to Unit-Interval (UI).

The DCC circuit (200) comprising at least a delay element (220) driven by the input signal (IN). The delay element further (220) comprises a plurality of delay lines (221-228), connected in series, to generate at least a plurality of intermediate delayed input signals ($N_0$-$N_n$), each delayed by at least a unit delay, as referred in FIG. 2-B.

The DCC circuit (200) further comprises an 8:1 multiplexer (202) which is implemented to select one of the delayed-signals ($N_0$-$N_7$). The selection from among the plurality of delayed-signals ($N_0$-$N_7$), can be done through a first control signal, referred to as SEL<2:0> in FIG. 2-A. The selection of one of the delayed-signal is based on the number of unit delays required in the input signal (IN).

The DCC circuit (200) further comprising an AND logic gate (206) to generate at least a decremented duty signal (Path2) when the Duty cycle of the input signal is more than ideal Duty Cycle based on the selected delayed signals and the input signal (IN) and an OR logic gate (204) to generate an incremented duty signal (Path1) when the Duty Cycle of the input signal is less than the ideal duty cycle. The operation of the OR logic gate (204) and the AND logic gate (206) is based on one of the selected delayed input signal ($N_0$-$N_7$) and the input signal (IN). The increment or decrement in the duty of the input signal may be based on the difference between the existing duty of the input signal and a required level of the duty for the input signal. Therefore, the selection of the delayed input signal ($N_0$-$N_7$) is based on the required level of the decrement/increment in the duty of the input signal.

The DCC circuit (200) further comprises a 2:1 multiplexer (208) for generating a corrected duty cycle, which may be based on the selection of at least one of the incremented duty cycle or decremented duty cycle by providing a second control signal, referred as SEL<3> in FIG. 2-A. The 2:1 multiplexer (208) is used here as a non-limiting aspect, for the selection of one of the incremented/decremented duty paths (Path1) or (Path2). A signal (112) with a corrected duty cycle can be obtained from the output of the multiplexer (208).

In another implementation of the present disclosure, there is provided a method for Duty Cycle Correction (DCC) of an input signal (IN), comprising at least a operation of generating, a plurality of intermediate delayed input signals ($N_0$-$N_n$), each delayed by at least a unit delay. The method further comprises selecting from among the plurality of delayed input-signals ($N_0$-$N_n$), through a first control signal. The selection is based on the number of unit delays required in the input signal (IN) which is further based on the requirement of increment/decrement in the duty of the input signal (IN). The method further comprises generating at least an incremented duty signal (Path1) and a decremented duty signal (Path2) based on the selected delayed signals and signal from at least one of the input signal (IN) or inverse of the input signal (INB). An OR logic (110) may be implemented for incrementing the duty of the selected input signal (IN or INB), wherein the increment in the duty of the signal can be managed through the number of unit delays required to be added with the selected input signal (IN or INB). Similarly, an AND logic (108) may be implemented for decrementing the duty of the selected input signal (IN or INB), wherein the decrement in the duty of the signal can be managed through the number of delays required to be added with the selected input signal (IN or INB).

The method further comprises selecting, at least one of the paths relating to incremented duty signal (Path1) or decremented duty signal (Path2). The method further comprises generating, an output signal with a corrected duty cycle based on the selection of at least one of the incremented duty signals (Path1) or the decremented duty signal (Path2) by providing a second control signal.

Figure 3A:
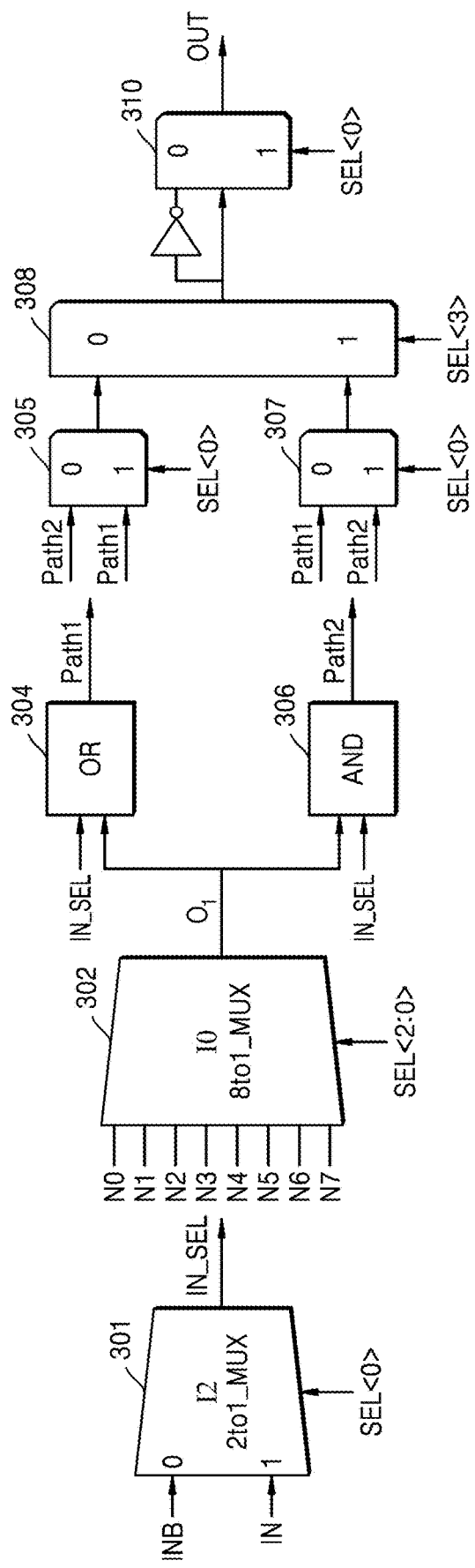
FIG. 3-A illustrates another implementation of the duty correction control circuit, in accordance with another example embodiment of the present subject matter.
Figure 3B:
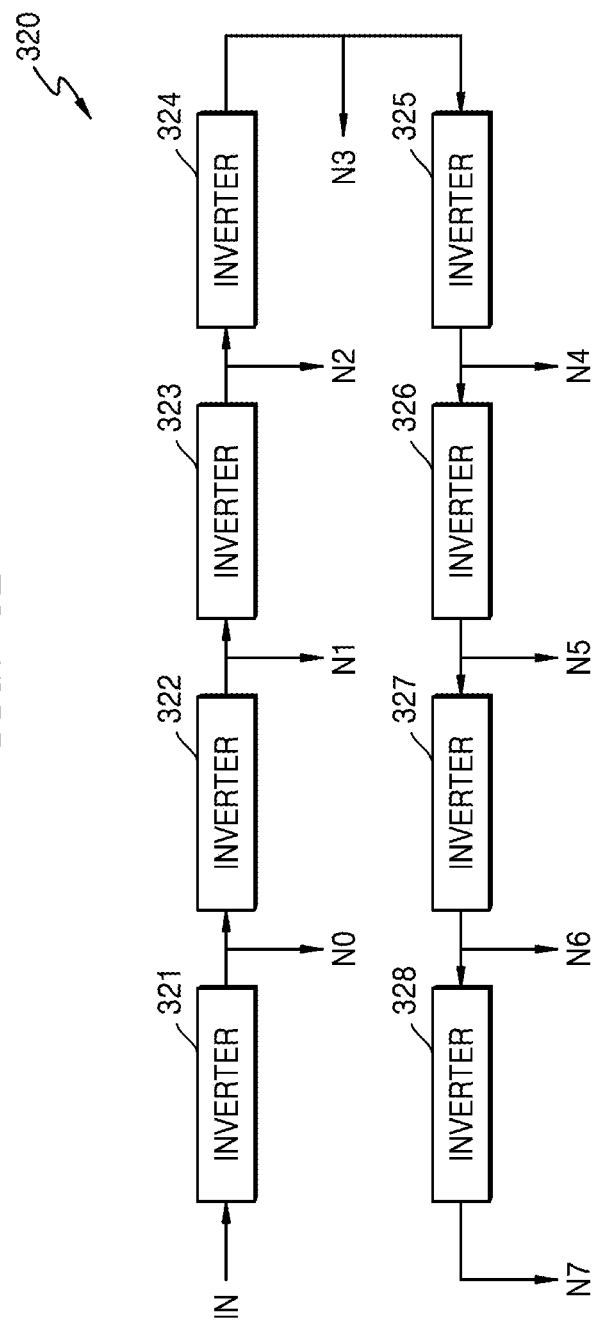

FIG. 3-A illustrates another implementation of the duty correction control circuit and FIG. 3-B illustrates an arrangement of delay elements in reference to FIG. 3-A, in accordance with another embodiment of the present subject matter.

In another implementation of the present disclosure, there is provided a Duty Cycle Correction (DCC) circuit (300) for correcting/adjusting the duty cycle of an input signal (IN). The DCC circuit (300) comprises a delay line (320) driven by the input signal (IN) to generate a plurality of intermediate delayed input signals ($N_0$-$N_n$). The intermediate each delayed signal is delayed by at least a unit delay from the previous signal. The delay line (320) may comprise a plurality of inverters (321-328) connected in series, wherein one of the intermediate delayed input signals ($N_0$-$N_n$) is obtained after each inverter (321-328). Each inverter (321-328) is adapted to produces minimum duty step, may be referred as ~one inverter delay that can be used for very high-speed applications.

The DCC circuit (300) comprises a 2:1 multiplexer (301), provide with a control signal SEL<0>, as referred in FIG. 3-B, to select one from the input signal (IN) or inverse of the input signal (INB).

The selected input signal (IN or INB) is used to generate at least an incremented duty signal (Path1) and a decremented duty signal (Path2) based on the selected delayed signals. An OR logic gate (304, 110) may be implemented for incrementing the duty of the selected input signal (IN or INB), wherein the increment in the duty of the signal can be managed through the number of delays required to be added with the selected input signal (IN or INB). Similarly, an AND logic gate (306, 108) may be implemented for decrementing the duty of the selected input signal (IN or INB), wherein the decrement in the duty of the signal can be managed through the number of delays required to be added with the selected input signal (IN or INB).

The DCC circuit (300) further comprises an (n+1):1 multiplexer (302) that can be implemented for the selection of one of the delayed input-signals ($N_0$-$N_n$). The selection among the plurality of delayed input signals ($N_0$-$N_n$) is controlled through a first control signal, also referred to as SEL<2:0> in FIG. 3-B. As a non-limiting factor, in the present implementation, an 8:1 multiplexer is used as an example, which may select the delayed input signal, ($N_0$-$N_7$). The selection is further based on the number of unit-delays required in the input signal (IN) which is further based on the requirement of increment/decrement in the duty of the input signal (IN).

The DCC circuit (300) further comprises a plurality of multiplexers (305, 307) may be used in parallel in order to relatively select the incremented duty signal (Path1) or decremented duty signal (Path2).

The DCC circuit (300) further comprises a multiplexer (308) which is meant for the final selection of the relatively selected signal from the previous multiplexer stages (305, 307) and for generating an output signal with corrected duty cycle. A second control signal, also referred to as SEL<3> in FIG. 3-B, is used for controlling the multiplexer (308).

Further, another 2:1 multiplexer stage (310) is provided to allow a selection-between the output and a complement of the output as final-output OUT based on the first control signal SEL<0> to thereby analogously provide the output in accordance with the input-stage (301) that allows the selection between the main input IN and its complement INB at the input stage (301). For example, the selection of INB at the input 301 results in the outputting of the complement of the output at the multiplexer stage (310).

In another implementation, when an LSB bit is 0 (e.g., when the select line, S<0>=0, is selected), the inverted input signal (IN) along with the inverted signal (INB) from the delay line (221-228, 320) (as referred in FIG. 2-B and FIG. 3-B) is provided to OR logic gate (110, 204, 304) and/or AND logic gate (108, 206, 306). The Multiplexer (301) selects the delayed input signal (INB) and passes the selected signal through AND/OR logic gates.

In another implementation, when the LSB bit is 1 (e.g., when select line S<0>=1 is selected). The buffered input signal (IN) along with buffered input signal from delay line (INB) is provided to AND logic gate (108, 206, 306) and/or OR logic gate (110, 204, 304). The Multiplexer (301) selects the input signal (IN) and passes the selected signal through AND/OR logic gates.

In another implementation, when the duty of the input signal is <50%, the select line SEL<3>='0', is selected from the Multiplexer (308) may further select the OR path (110, 204, 304), which keeps on increasing the SEL<2:0> bits of Multiplexer (302) till the DUTY reaches close to 50%.

In another implementation, when the duty of the input signal is >50%, the select line SEL<3>='1', is selected from the Multiplexer (308) may further select the AND path (108, 206, 306), which keeps on increasing the SEL<2:0> bits of Multiplexer (302) till the DUTY reaches close to 50%.

Any of the elements disclosed may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Example Use Case:

Mentioned below are different scenarios related to the method relating to Duty Cycle Correction (DCC):

| SEL<0> | IN | INB | IN_SEL |
|---|---|---|---|
| 0 | Signal | Inverted signal | Inverted signal |
| 1 | Signal | Inverted signal | Signal |

When Signal is 40% of duty

| SEL<0> | IN | INB | IN_SEL |
|---|---|---|---|
| 0 | 40% of Duty | 60% of Duty | 60% of Duty |
| 1 | 40% of Duty | 60% of Duty | 40% of Duty |

When Signal is 60% of duty

| SEL<0> | IN | INB | IN SEL |
|---|---|---|---|
| 0 | 60% of Duty | 40% of Duty | 40% of Duty |
| 1 | 60% of Duty | 40% of Duty | 60% of Duty |

| SEL<2:0> | Path1 | Path2 | A<br>[Sel<0>=0,<br>A=Path2]<br>[Sel<0>=1,<br>A=Path1] | B<br>[Sel<0>=0,<br>A=Path1]<br>[Sel<0>=1,<br>A=Path2] | OUT<br>[Sel<3>=1<br>For Sel<0> =0<br>OUT = Inv $\tilde{A}$<br>For Sel<0> =1,<br>OUT= $\tilde{A}$ |
|---|---|---|---|---|---|

-continued

| SEL<2:0> | Path1 | Path2 | A<br>[Sel<0>=0,<br>A=Path2]<br>[Sel<0>=1,<br>A=Path1] | B<br>[Sel<0>=0,<br>A=Path1]<br>[Sel<0>=1,<br>A=Path2] | OUT<br>For Sel<0> =1,<br>OUT= A<br>[Sel<3>=1<br>For Sel<0> =0<br>OUT = Inv B<br>For Sel<0> =1,<br>OUT= B |
|---|---|---|---|---|---|

If S<3>=0 → Path 1 selected and Duty increases with respect to select bits[s<2:0>]
If S<3>=1 → Path 1 selected and Duty increases with respect to select bits[s<2:0>]

If input duty comes as 40%:
Inverter Delay is 2% of $T_{ON}/T_{OFF}$ [step size is 2%]

| SEL<2:0> | Path1 | Path2 | A<br>[Sel<0>=0,<br>A=Path2]<br>[Sel<0>=1,<br>A=Path1] | B<br>[Sel<0>=0,<br>A=Path1]<br>[Sel<0>=1,<br>A=Path2] | OUT<br>[Sel<3>=1<br>For Sel<0> =0<br>OUT = Inv A<br>For Sel<0> =1,<br>OUT= A |
|---|---|---|---|---|---|
| 000 | 62% | 58% | 58% | 62% | 42% |
| 001 | 44% | 36% | 44% | 36% | 44% |
| 010 | 66% | 54% | 54% | 66% | 46% |
| 011 | 48% | 32% | 48% | 32% | 48% |
| 100 | 70% | 50% | 50% | 70% | 50% |
| 101 | 52% | 28% | 52% | 28% | 52% |
| 110 | 74% | 46% | 46% | 74% | 54% |
| 111 | 56% | 24% | 56% | 24% | 56% |

If input duty comes as 60%:
Inverter Delay is 2% of $T_{ON}/T_{OFF}$ [step size is 2%]

| SEL<2:0> | Path1 | Path2 | A<br>[Sel<0>=0,<br>A=Path2]<br>[Sel<0>=1,<br>A=Path1] | B<br>[Sel<0>=0,<br>A=Path1]<br>[Sel<0>=1,<br>A=Path2] | OUT<br>[Sel<3>=1<br>For Sel<0> =0<br>OUT = inv B<br>For Sel<0> =1,<br>OUT= B |
|---|---|---|---|---|---|
| 000 | 42% | 38% | 38% | 42% | 58% |
| 001 | 64% | 56% | 64% | 56% | 56% |
| 010 | 46% | 34% | 34% | 46% | 54% |
| 011 | 68% | 52% | 68% | 52% | 52% |
| 100 | 50% | 30% | 30% | 50% | 50% |
| 101 | 72% | 48% | 72% | 48% | 48% |
| 110 | 54% | 26% | 26% | 54% | 46% |
| 111 | 76% | 44% | 76% | 44% | 44% |

Figure 4:
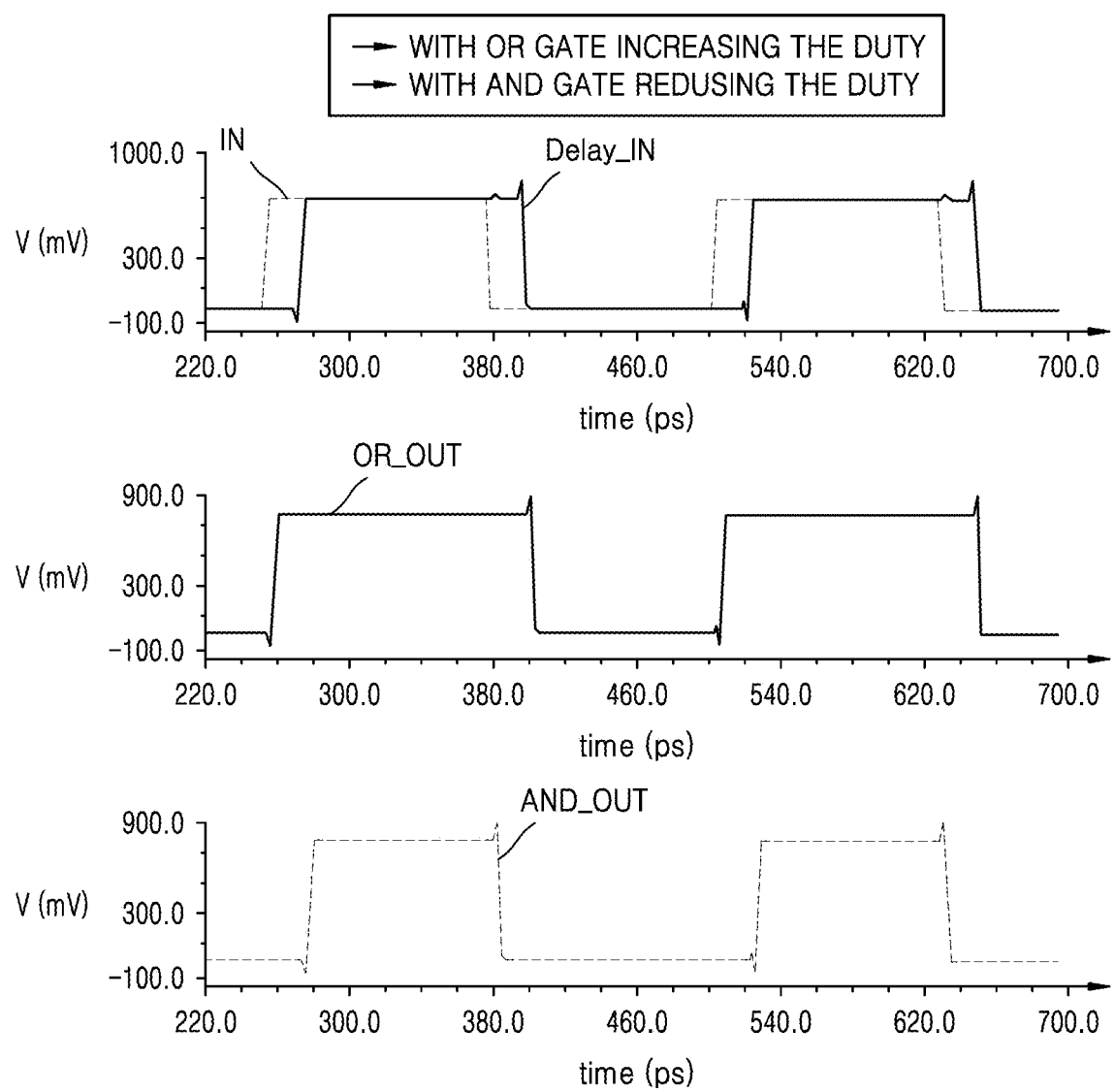
FIG. 4 illustrates the output waveforms of corresponding incremented duty signal (Path1) and a decremented duty signal (Path2), in accordance with another example embodiment of the present subject matter.

FIG. 4 depicts the output waveforms of the corresponding incremented duty signal (Path1) and decremented duty signal (Path2), in accordance with another example embodiment of the present subject matter. The first waveform (from top) depicts an input signal (IN) and the signal after being delayed (Delay_IN). The middle waveform depicts the incremented signal (OR-OUT) obtained after the OR logic gate (Path1), wherein the input signal (IN) is incremented with specific delay units. The last waveform depicts the decremented signal (AND_OUT) obtained after the OR logic gate (Path1), wherein the input signal (IN) is decremented with specific delay units. The increment/decrement of the input signal (IN) is based on the difference between the input signal (IN) and the signal after being delayed (Delay_IN).

Figure 5:
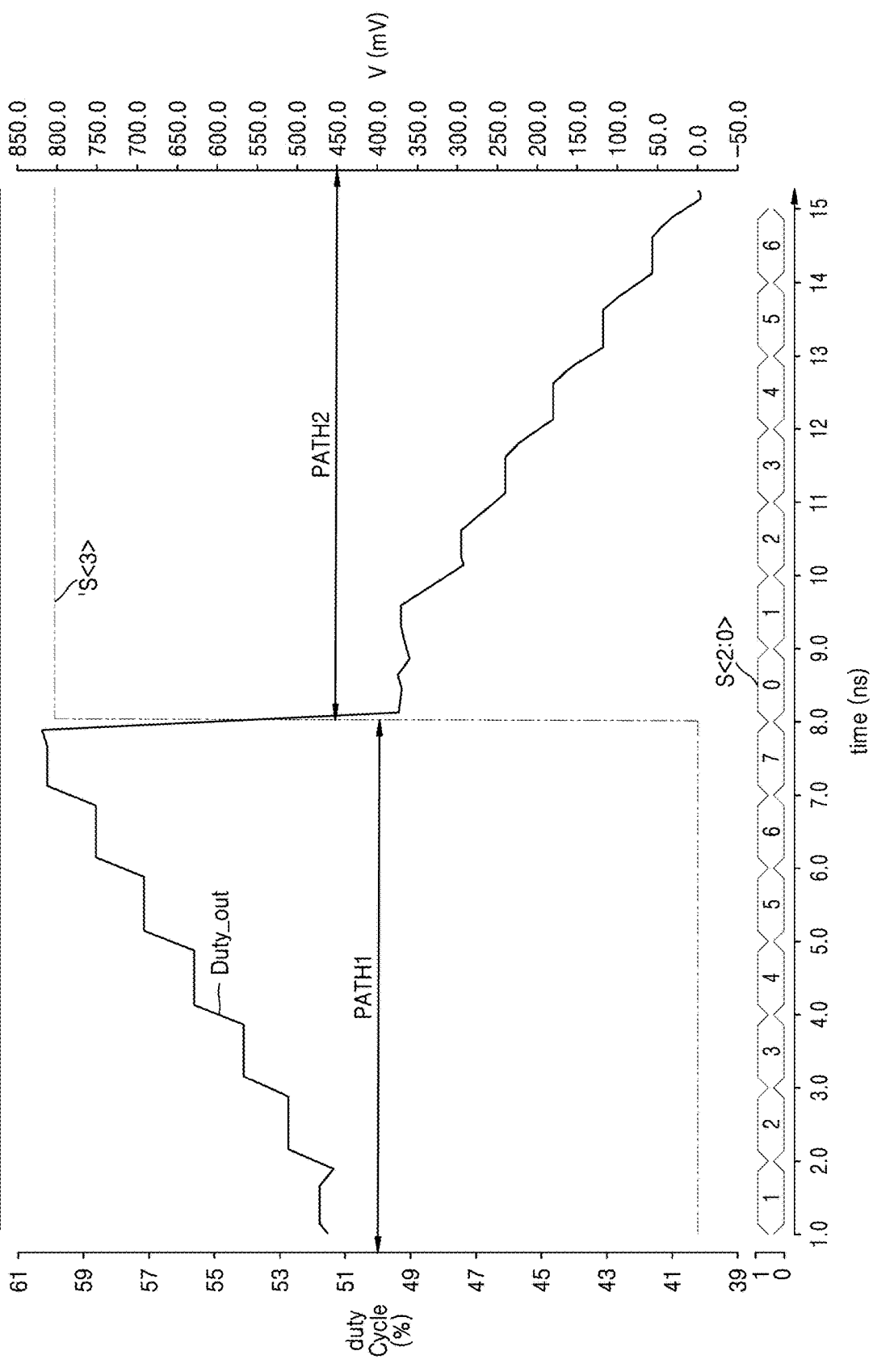
FIG. 5 illustrates the output duty variation corresponding to incremented duty signal (Path1) and decremented duty signal (Path2), in accordance with another example embodiment of the present subject matter.

FIG. 5 depicts the output duty variation corresponding to the incremented duty signal (Path1) and decremented duty signal (Path2), in accordance with another example embodiment of the present subject matter.

Figure 6A:
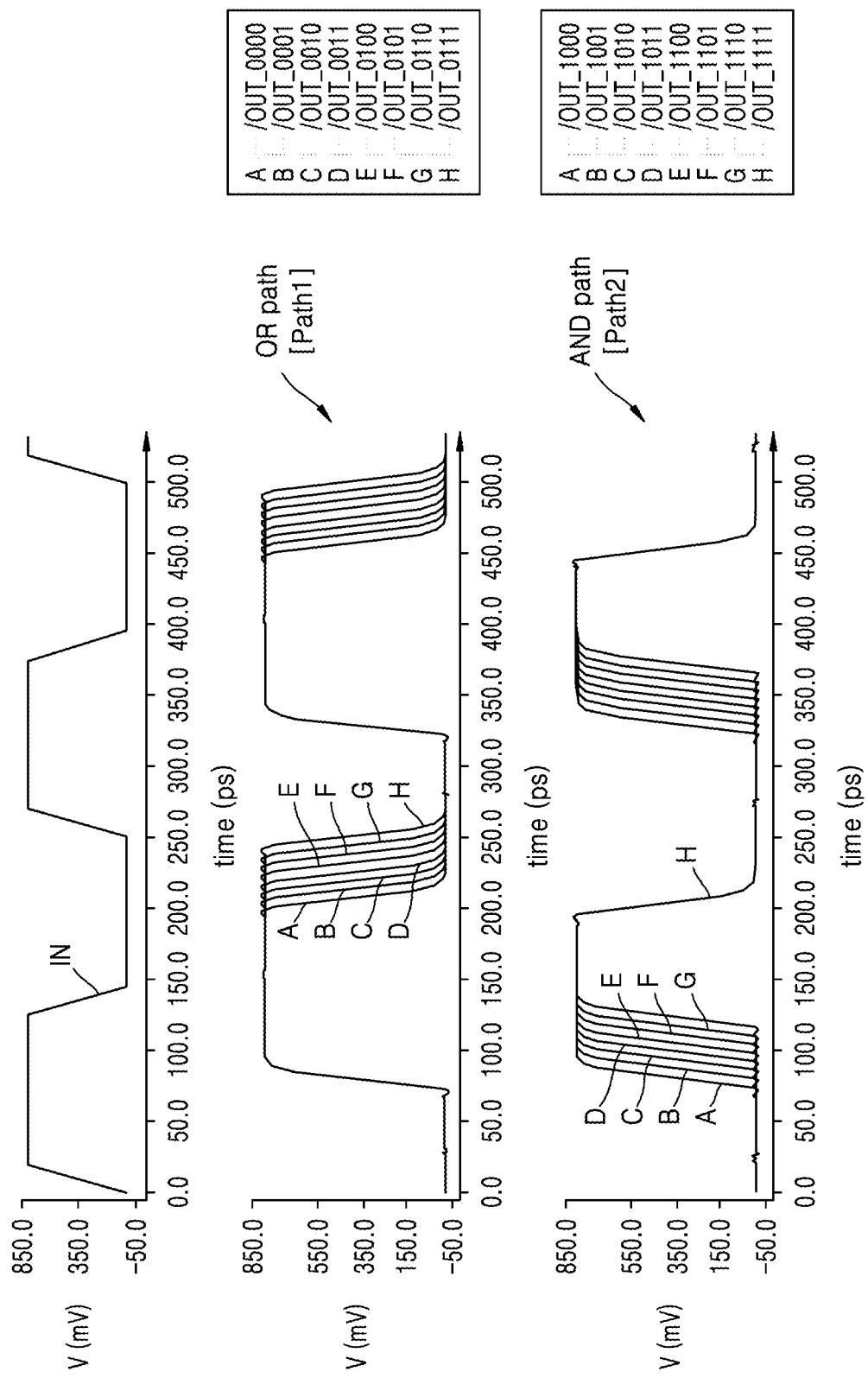
FIGS. 6A, 6B, and 6C illustrate the duty spread output waveforms corresponding to OR path (Path1) and AND path (Path2), in accordance with another example embodiment of the present subject matter.
Figure 6B:
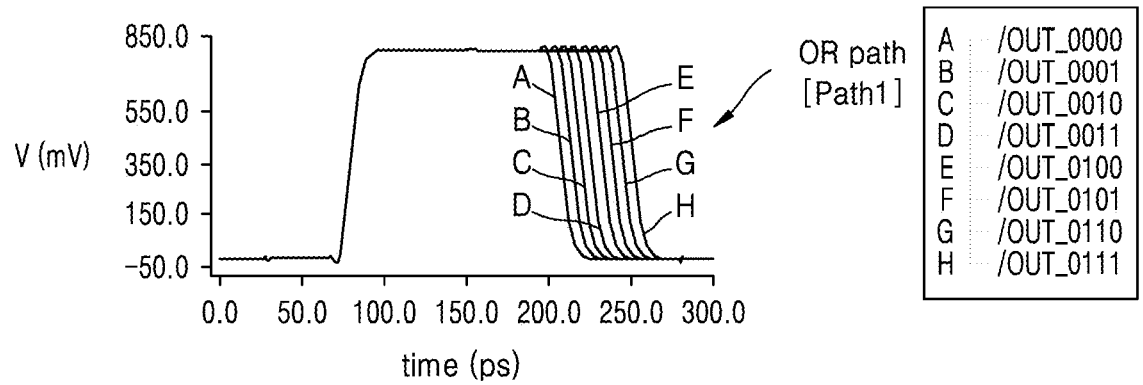
Figure 6C:
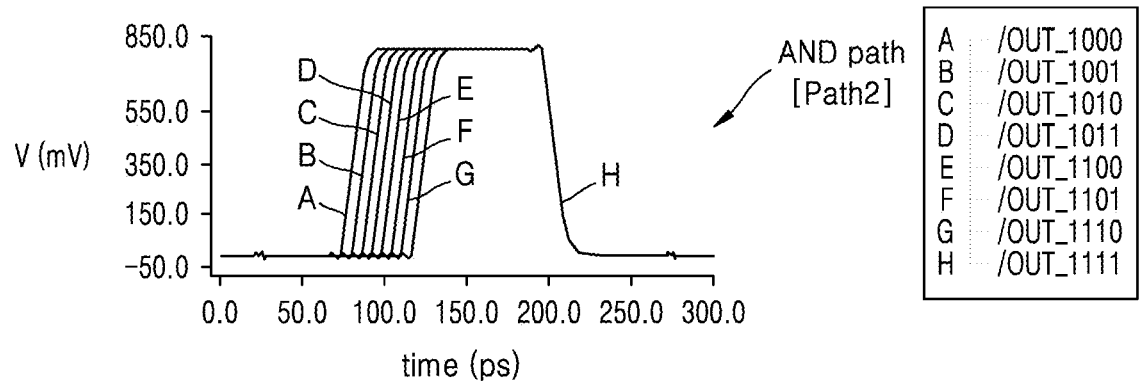

FIGS. 6A, 6B, and 6C illustrate the duty spread output waveforms corresponding to OR path (path1) and AND path (path2), in accordance with another example embodiment of the present subject matter. The waveforms referred in FIG. 6A clearly depicts the comparative analysis between of input signal (IN) and the scaled signals at two different paths, that is, the incremented signal(s) (Path1) obtained after OR path, and the decremented signal(s) (Path2) obtained after AND path. Further, the waveforms of the scaled signals (incremented or decremented) demonstrates the variation in levels of scaling (A-H) which is based on the selection of the number of unit delays through delayed-signals ($N_0$-$N_7$). FIGS. 6B and 6C are upscale-images and precisely depicts the levels of scaling (A-H) achieved across Path1 and Path2, respectively.

Experimental Results:

In an example, a general scenario is considered where a DCC circuit is used for the analysis of various parameters. Table 1 illustrates comparison-results of conventional technology with the DDC circuit of the present disclosure:

TABLE 1

| Parameter | State of the art technology | Present subject matter |
| --- | --- | --- |
| Step size variation | 0.5% to 5.25% | 1.4% to 4.5% |
| Duty Correction capability | 39% to 58% | 34% to 66% |
| Power consumption | 1.21 mA | 800 uA |
| Area | 100 $\mu m^2$ | 85.6 $\mu m^2$ |
| Monotonicity | No | Yes |

In view of the aforesaid, there are provided various advantageous features relating to the present disclosure:

Lower power lower area duty cycle correction based standard cells.

Higher probability or guaranteed monotonicity.

Application in higher-speed electronic devices.

Wider Duty correction range with more uniform step size can be achieved with at least one example embodiments.

At least one example embodiment offers lower power consumption as compared to previous designs.

Since at least one example embodiment occupies a lower area as compared to previous designs, the circuit can be used in the applications where the area is one of the major constraints.

While specific language has been used to describe the present subject matter, any limitations arising on account thereto, are not intended. As would be apparent to a person in the art, various working modifications may be made to the method in order to implement the inventive concept as taught herein. The drawings and the foregoing description give examples of example embodiments. Those skilled in the art will appreciate that one or more of the described elements may well be combined into a single functional element. Alternatively, certain elements may be split into multiple functional elements. Elements from one example embodiment may be added to another example embodiment.

We claim:

1. A method for Duty Cycle Correction of an input signal for a transceiver, the method comprising following operations of:

detecting a Duty Cycle of the input signal and an Ideal Duty Cycle of the input signal received by the transceiver;

determining whether the Duty Cycle of the input signal is more or less than the Ideal Duty Cycle, wherein the Ideal Duty Cycle corresponding to Unit-Interval;

generating, a plurality of delayed input signals, each delayed by at least a unit delay, through a delay-line driven by the input signal;

selecting at least one delayed input signal from among the plurality of delayed input signals, based on the determined difference between the Duty Cycle of the input signal and the Ideal Duty Cycle;

generating at least one of:

an incremented duty signal (Path1) when the Duty Cycle of the input signal is less than the ideal duty cycle, and a decremented duty signal (Path2) when the Duty cycle of the input signal is more than Ideal Duty Cycle based on the selected delayed signals and the input signal.

2. The method as claimed in claim 1, wherein a corrected duty cycle is outputted after the increment in the duty cycle or decrement in the duty cycle, where said increment in duty cycle is performed till the detected duty cycle of the input signal reaches less than a threshold or the decrement is the duty cycle is performed till the detected duty cycle of the input signal reaches greater than the threshold.

3. The method as claimed in claim 1, wherein the increment in the duty of the selected delayed-signal is performed when the duty of the input signal is at least less than the threshold and the decrement in the duty of the selected delayed-signal is performed when the duty of the selected input signal is at least greater than the threshold.

4. The method as claimed in claim 1, wherein the incremented signal is generated through an OR logic operation and the decremented signal is generated through an AND logic operation, performed on selected delayed signal and one of: the signal selected from the input signal and an inverted input signal, wherein the selection of at least one delayed input signal from among the plurality of delayed input signals, through a first control signal is based on the determining of the Duty Cycle.

5. The method as claimed in claim 1, wherein either the increment of the duty through OR logic operation or decrement of the duty cycle through AND logic operation is performed stepwise till the duty of the signal reaches a desired level.

6. A Duty Cycle Correction circuit for a transceiver, comprising:

a delay-line comprising a plurality of delay components, driven by an input signal and configured to generate a plurality of delayed input signals, each said delayed input signal is delayed by at least a unit delay;

first logic, controlled by a first control signal, configured to receive the plurality of delay-signals and configured to select at least one of the delayed-signal as a first signal;

a plurality of duty scaling components comprising one or more of an incrementing component configured to generate at least an incremented duty signal (Path1) when a Duty Cycle of the input signal is less than the ideal duty cycle and a decrementing component configured to generate a decremented duty signal (Path2) when the Duty cycle of the input signal is more than the ideal Duty Cycle, based on the selected delayed signals and the input signal;

path correction logic configured to generate a corrected duty cycle based on the selection of at least one of: the incremented duty cycle or decremented duty cycle by providing a second control signal, wherein the increment or decrement in duty cycle is performed until the detected duty cycle of the input signal remains lesser or greater than a threshold level.

7. The DCC circuit as claimed in claim 6, wherein the delay components comprises at least one of:
a plurality of inverters or a plurality of sub-delay lines, coupled in a series, where an output after each said delay component generates the delay-signal.

8. The DCC circuit as claimed in claim 6, wherein the first logic comprises at least an (n+1):1 multiplexer.

9. The DCC circuit as claimed in claim 6, wherein the incrementing component for generating an incremented duty signal (Path1) comprises an OR logic gate and the decrementing component for generating a decremented duty signal (Path2) comprises an AND logic gate.

10. The DCC circuit as claimed in claim 6, wherein the DCC circuit further comprises path selection logic configured to select at least one of: Path1 or Path2 to increase or decrease the duty of the signal, respectively.

11. The DCC circuit as claimed in claim 6, wherein the DCC circuit further comprises auxiliary logic configured to select the scaled duty signal.

12. A Duty Cycle Correction (DCC) circuit for a transceiver, comprising:
processing circuitry configured to:
generate a plurality of delayed input signals, each said delayed input signal is delayed by at least a unit delay;
receive the plurality of delay-signals to select at least one of the delayed-signal as a first signal;
generate an incremented duty signal (Path1) when a Duty Cycle of the input signal is less than an ideal duty cycle and a decremented duty signal (Path2) when the Duty cycle of the input signal is more than the ideal Duty Cycle, based on the first signal and the input signal;
generate a corrected duty cycle based on the selection of at least one of:
the incremented duty cycle or decremented duty cycle by providing a second control signal, wherein the increment or decrement in duty cycle is performed until the detected duty cycle of the input signal remains lesser or greater than a threshold level.

13. The DCC circuit as claimed in claim 12, wherein the processing circuitry includes at least one of a plurality of inverters or a plurality of sub-delay lines, coupled in a series, where an output after each said plurality of inverters or said plurality of sub-delay lines generates at least one of the plurality of delayed input signals.

14. The DCC circuit as claimed in claim 12, wherein the processing circuitry includes at least an (n+1):1 multiplexer.

15. The DCC circuit as claimed in claim 12, wherein the processing circuitry includes an OR logic gate configured to generate the incremented duty signal (Path1) and an AND logic gate configured to generate the decremented duty signal (Path2).

16. The DCC circuit as claimed in claim 12, wherein the processing circuitry further comprises path selection logic configured to select at least one of Path1 or Path2 to increase or decrease the duty of the input signal, respectively.

17. The DCC circuit as claimed in claim 12, wherein the processing circuitry further comprises auxiliary logic levels configured to select the scaled duty signal.

* * * * *